United States Patent
Jang

(10) Patent No.: US 7,845,785 B2
(45) Date of Patent: *Dec. 7, 2010

(54) CATIONIC INK FORMULATIONS

(75) Inventor: James M. Jang, Keene, NH (US)

(73) Assignee: Markem-Imaje Corporation, Keene, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/503,309

(22) Filed: Aug. 11, 2006

(65) Prior Publication Data

US 2007/0035602 A1    Feb. 15, 2007

Related U.S. Application Data

(60) Provisional application No. 60/707,898, filed on Aug. 12, 2005.

(51) Int. Cl.
*G01D 11/00* (2006.01)
(52) U.S. Cl. ............... 347/100; 347/95; 523/160
(58) Field of Classification Search .......... 347/100, 347/95, 96, 101, 102; 106/31.6, 31.27, 31.13, 106/31.46; 523/160
See application file for complete search history.

(56) References Cited

U.S. PATENT DOCUMENTS

| | | | | |
|---|---|---|---|---|
| 3,935,173 A | * | 1/1976 | Ogasawara et al. | 522/104 |
| 3,984,340 A | * | 10/1976 | Sheratte | 252/78.5 |
| 4,159,203 A | * | 6/1979 | Loock | 347/100 |
| 5,623,001 A | * | 4/1997 | Figov | 347/100 |
| 6,232,361 B1 | * | 5/2001 | Laksin et al. | 106/31.6 |
| 6,280,905 B1 | * | 8/2001 | Koshimura et al. | 430/907 |
| 6,294,592 B1 | | 9/2001 | Herrmann et al. | |
| 2002/0086161 A1 | | 7/2002 | Smetana et al. | |
| 2003/0094738 A1 | | 5/2003 | Maeda et al. | |
| 2004/0050292 A1 | | 3/2004 | Nakajima et al. | |
| 2004/0252171 A1 | | 12/2004 | Nishizeki et al. | |
| 2005/0042458 A1 | | 2/2005 | Ghoshal | |
| 2006/0222832 A1 | | 10/2006 | Shimohara | |

FOREIGN PATENT DOCUMENTS

| | | |
|---|---|---|
| EP | 0993495 | 4/2003 |
| EP | 1486526 | 8/2006 |
| EP | 1705229 | 9/2006 |
| WO | 02/064689 | 8/2002 |

OTHER PUBLICATIONS

International Search Report, WIPO Patent Application No. PCT/US2006/031349, dated Jan. 5, 2007.
International Search Report, WIPO Patent Application No. PCT/US2006/031612, dated Jan. 26, 2007.
International Search Report, WIPO Patent Application No. PCT/US2006/031351, dated Apr. 25, 2007.
Supplementary European Search Report, European Patent Application No. 06789697.7, dated Jan. 29, 2010.

* cited by examiner

*Primary Examiner*—Manish S Shah
(74) *Attorney, Agent, or Firm*—Fish & Richardson P.C.

(57) ABSTRACT

A printing method includes jetting a curable ink including at least one of an oxetane compound, a siloxane compound, or a sulfide compound onto a substrate.

16 Claims, 1 Drawing Sheet

US 7,845,785 B2

CATIONIC INK FORMULATIONS

CLAIM OF PRIORITY

This application claims priority under 35 USC §119(e) to U.S. Patent Application Ser. No. 60/707,898, filed on Aug. 12, 2005, the entire contents of which are hereby incorporated by reference.

FIELD OF THE INVENTION

The invention relates to inks.

BACKGROUND

During inkjet printing, ink is ejected, generally at elevated temperature, from a component of an inkjet printer (e.g., from one or more nozzles of a print head) onto a substrate. In some instances, the ejecting is followed by a curing step. One method of curing involves exposing to ultraviolet (UV) radiation an ink that contains reactive reagents that polymerize upon exposure to UV radiation. Typically, the ink is exposed to UV radiation within milliseconds of printing on the substrate. The rapid exposure to UV radiation controls dot gain and is known as pinning.

Examples of inkjet printing are described in U.S. Ser. No. 11/058,777, filed Feb. 16, 2005, published as US 20050195265, and U.S. provisional application No. 60/549,645, filed Mar. 3, 2004, both of which are incorporated by reference herein in their entirety.

SUMMARY

The invention relates to inks.

One aspect of the invention relates to an ink including at least one oxetane compound. The oxetane compound has one or more (e.g., multiple) oxetane groups.

In some embodiments, a method includes jetting ink onto a substrate to provide a mark. The ink includes an oxetane compound and a photoinitiating system. The ink may include a colorant. The ink may be cured by exposing the mark to light (e.g., visible light, ultraviolet radiation having a wavelength of less than about 400 nanometers, or a combination thereof).

In some embodiments, the oxetane compound has a viscosity of at least about 25 centipoises at a temperature of 25° C.

In some embodiments, the oxetane compound has a flash point (open cup) of more than 115° C.

In some embodiments, the oxetane compound has a boiling point of greater than about 110° C. at a pressure of 5 mm Hg.

In some embodiments, the oxetane compound has a molecular weight of more than about 130 grams per mole.

In some embodiments, the oxetane compound includes at least one of 3,3'-oxybis(methylene)bis(3-ethyloxetane), 1,4-bis(((3-ethyloxetan-3-yl)methoxy)methyl)benzene, or 3-ethyl-3-[(2-ethylhexyloxy)methyl]oxetane.

The ink may further include an epoxide compound (e.g., at least one of a siloxane epoxide compound, a cylcoaliphatic epoxide compound, or a glycidyl ether epoxide compound).

In some embodiments, the ink includes at least about 20% by weight of oxetane compound and at least about 20% by weight of the epoxide compound.

The ink may include at least one of an alcohol, a polyol, or an ester.

In some embodiments, the ink further comprises a sulfur compound (e.g., a sulfide compound). The ink may include at least about 0.1% by weight of the sulfide compound. The amount of sulfide compound may be about 2% or less by weight of the ink.

The sulfide compound may be a diphenyl sulfide compound, a di-alkyl sulfide compound, or a combination thereof.

In some embodiments, the ink jetted onto the substrate to provide the mark has an ASTM 3363 pencil hardness test value of at least about 4H on a glass substrate.

The substrate may be, for example, a glass substrate or a printed circuit board.

The photoinitiating system may include an initiator and a sensitizer (e.g., a polycyclic aromatic compound).

In some embodiments, the method includes waiting for at least two seconds after the jetting the ink before initiating the curing of the ink.

In some embodiments, the step of jetting the ink includes jetting the ink onto each of multiple substrates to provide a mark on each of the substrates and the step of curing the ink includes curing the ink on each of the substrates by exposing the marks to light after jetting the ink onto the multiple substrates.

In some embodiments, the invention relates to a composition including a cationic reagent, an oxetane compound different from the cationic reagent and having multiple oxetane rings, a photoinitiating system, and a colorant. The composition has a viscosity of about 50 centipoises or less (e.g., about 35 centipoise or less).

In some embodiments, the composition is present in an inkjet printer nozzle.

In some embodiments, the invention relates to an inkjet printer cartridge including a reservoir including a composition that includes an oxetane compound having multiple oxetane rings, a photoinitiating system, and a colorant. The ink composition may further include a cationic reagent different from the oxetane compound.

In some embodiments, the invention relates to a method that includes jetting ink onto a substrate to provide a mark. The ink includes an oxetane compound having a viscosity of least about 25 centipoises at 25° C., a photoinitiating system, and a colorant. The ink is cured by exposing the mark to light.

In some embodiments, the invention relates to a method that includes jetting ink onto a substrate to provide a mark, the ink includes an oxetane compound having an open cup flash point of more than 115° C., a photoinitiating system, and a colorant. The ink is cured by exposing the mark to light.

In some embodiments, the invention relates to a method that includes jetting ink onto a substrate to provide a mark. The ink includes an oxetane compound having a boiling point of more than about 90° C. at a pressure of 1 atmosphere, a photoinitiating system, and a colorant. The ink is cured by exposing the mark to light.

In some embodiments, the invention relates to a method that includes jetting ink onto a substrate to provide a mark. The ink includes an oxetane compound having a molecular weight of more than about 130 grams per mole, a photoinitiating system, and a colorant. The ink is cured by exposing the mark to light.

Another aspect of the invention relates to an ink including at least one siloxane compound.

In some embodiments, a method includes jetting ink onto a substrate to provide a mark. The ink includes a cationic reagent having at least one siloxane group and a photoinitiating system. The ink may include a colorant. The ink may be cured by exposure to light (e.g., visible light, ultraviolet radiation having a wavelength of less than about 400 nanometers, or a combination thereof).

The cationic reagent may be a siloxane epoxide.

The ink may further include an oxetane compound (e.g., an oxetane compound with multiple oxetane rings). The oxetane compound may include, for example, at least one of 3,3'-oxybis(methylene)bis(3-ethyloxetane), 1,4-bis(((3-ethyloxetan-3-yl)methoxy)methyl)benzene, or 3-ethyl-3-[(2-ethylhexyloxy)methyl]oxetane.

In some embodiments, the oxetane compound has a viscosity of at least about 25 centipoises at a temperature of 25° C.

In some embodiments, the oxetane compound has a flash point (open cup) of more than 115° C.

In some embodiments, the oxetane compound has a boiling point of greater than about 110° C. at a pressure of 5 mm Hg.

In some embodiments, the oxetane compound has a molecular weight of more than about 130 grams per mole.

In some embodiments, the ink includes at least about 20% by weight of the oxetane compound and at least about 20% by weight of the siloxane epoxide compound.

The ink may further include at least one of a cylcoaliphatic epoxide compound or a glycidyl ether epoxide compound.

The siloxane compound may include multiple siloxane groups.

The siloxane compound may include, as defined below, PC1000, PC2003, a derivative of PC1000, a derivative of PC2003, or a combination thereof.

In some embodiments, the ink further comprises a sulfur compound (e.g., a sulfide compound). The ink may include at least about 0.1% by weight of the sulfide compound. The amount of sulfide compound may be about 2% or less by weight of the ink.

The sulfide compound may be a diphenyl sulfide compound, a di-alkyl sulfide compound, or a combination thereof.

In some embodiments, the ink jetted onto the substrate to provide the mark has an ASTM 3363 pencil hardness test value of at least about 4H on a glass substrate.

The substrate may be, for example, a glass substrate or a printed circuit board.

The photoinitiating system may include an initiator and a sensitizer (e.g., a polycyclic aromatic compound).

In some embodiments, the method includes waiting for at least two seconds after the jetting the ink before initiating the curing of the ink.

In some embodiments, the step of jetting the ink includes jetting the ink onto each of multiple substrates to provide a mark on each of the substrates and the step of curing the ink includes curing the ink on each of the substrates by exposing the marks to light after jetting the ink onto the multiple substrates.

Another aspect of the invention relates to a composition that includes a first cationic reagent, a second cationic reagent having at least one siloxane group and a photoinitiating system. The second cationic reagent is different from the first cationic reagent. The composition may include a colorant. The composition has a viscosity of about 50 centipoises or less (e.g., about 35 centipoises or less).

The composition may be present in an inkjet printer nozzle.

The second cationic reagent may be a siloxane epoxide.

Another aspect of the invention relates to an inkjet printer cartridge that includes a reservoir including a composition that includes a cationic reagent having at least one siloxane group, a photoinitiating system, and a colorant.

The cationic reagent may be a siloxane epoxide.

The cationic reagent may be a first cationic reagent and the ink composition may further include a second cationic reagent different from the first cationic reagent.

Another aspect of the invention relates to an ink including at least one inhibitor. The inhibitor may be a sulfide compound.

In some embodiments, a method includes jetting an ink that includes a sulfide compound onto a substrate. The ink may also include at least one of a cationic reagent, a photoinitiating system, a sulfide compound, and a colorant. The ink may be cured by exposing the mark to light (e.g., visible light, ultraviolet radiation having a wavelength of less than about 400 nanometers, or a combination thereof).

The sulfide compound may include at least one of a diphenyl sulfide compound or a dialkyl sulfide compound.

The cationic reagent may include an epoxide compound (e.g., an epoxide compound that has multiple expoxy rings).

The substrate may be, for example, a glass substrate or a printed circuit board.

The cationic reagent may include at least one of a siloxane epoxide compound, a cylcoaliphatic epoxide compound, or a glycidyl ether epoxide compound.

The ink can include at least about 20% by weight of oxetane compound and at least about 20% by weight of the epoxide compound.

In some embodiments of the invention, a composition includes a cationic reagent, a photoinitiating system, a sulfide compound, and a colorant. The composition may have a viscosity of about 50 centipoises or less (e.g., about 35 centipoises or less).

In some embodiments, the composition is present in an inkjet printer nozzle.

In some embodiments, the viscosity of the composition determined at temperature of about 68° C. increases by about 10% or less (e.g., about 7.5% or less, about 5% or less) after storage of the ink at 70° in the dark for at least 7 days (e.g., 14 days, 21 days, or 30 days).

In some embodiments, the invention relates to an inkjet printer cartridge that includes a reservoir that includes a composition that includes a cationic reagent, a photoinitiating system, a sulfide compound, and a colorant.

Another aspect of the invention relates to a method of printing an ink described herein.

Another aspect of the invention relates to a substrate (e.g., a glass substrate or a printed circuit board) having one or marks formed of an ink described herein.

Another aspect of the invention relates to an ink reservoir (e.g., an ink cartridge for an inkjet printer) including an ink described herein.

Other features, objects, and advantages of the invention will be apparent from the description and from the claims.

DETAILED DESCRIPTION

Figure 1A:
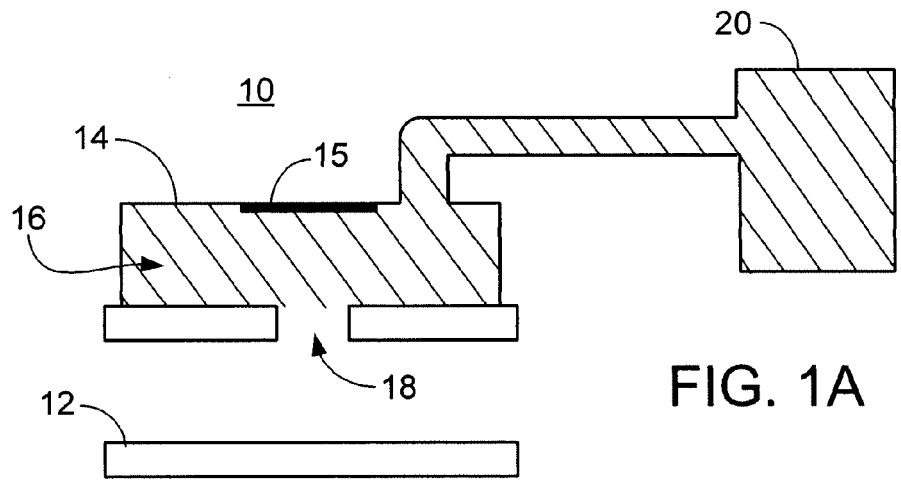
FIGS. 1A-1C illustrate a printing assembly of an inkjet printer.

An ink includes one or more cationic reagents (e.g., at least one oxetane compound, at least one siloxane compound, or combination thereof) and, typically, a photoinitiating system. The ink can be jetted onto a substrate using an inkjet printer (e.g., from one or more nozzles of a print head of an inkjet printer) to provide a mark. The ink of the mark is cured by exposing the mark to light (e.g., visible light, ultraviolet radiation having a wavelength of less than about 400 nanometers, or a combination thereof). A component of the photoinitiating system (e.g., a photoinitiator) absorbs the light and initiates polymerization of the one or more cationic reagents of the ink. The polymerization typically cures the mark.

The cationic reagents contribute to desirable properties of the ink prior to curing (e.g., viscosity, vapor pressure, or boiling point) while providing a cured mark with desired properties (e.g., hardness, flexibility). For example, a cationic reagent (or a combination of cationic reagents) may have a viscosity at printing temperature that permits the ink to be jetted but a vapor pressure sufficiently low to reduce (e.g., prevent) evaporation of the reagent during storage and handling. The cured mark may have a hardness that resists damage (e.g., upon impact or abrasion) yet is flexible enough to resist cracking.

An ink may include an inhibitor that reduces (e.g., prevents) polymerization of the ink in the absence of light. The inhibitor can contribute to storage and handling properties of the ink by reducing (e.g., preventing) a tendency of the viscosity of the ink to increase before being jetted and cured by light exposure.

The ink may also include at least one other component such as a colorant or a rheological modifying additive.

Inks and related systems and methods are discussed below.

Cationic Reagents

A cationic reagent typically includes at least one cyclic ether group (e.g., one or more epoxide groups (e.g., a three-member cyclic ether), one or more oxetane groups (e.g., a four member cyclic ether), or a combination of such groups). Polymerization of the cationic reagent typically includes a ring-opening reaction of the cyclic ether group(s) of the reagent (e.g., cationic ring opening polymerization). The polymerization can be initiated by, for example, an initiating species (e.g., a cation) formed by a photoinitiator upon absorption of light by the photoinitiator.

The cationic reagent can be a monomer or an oligomer (e.g., a compound having multiple repeat units, at least some of which (e.g., most or all) typically have at least one cyclic ether group).

In some embodiments, the cationic reagent is an oxetane compound having at least one oxetane group (e.g., at least two oxetane groups or more). An ink may include a combination of such oxetane compounds.

The oxetane compound may have chemical and/or physical properties as desired.

In some embodiments, a viscosity of the oxetane compound is at least about 25 centipoises (e.g., at least about 30 centipoises, at least about 50 centipoises, at least about 75 centipoises) at a temperature of 25° C. Unless specified otherwise, all viscosities referred to herein are measured using a Brookfield DV-II viscometer, a SC418 spindle, a Brookfield Thermosel for temperature control, generally operated at a 60, 30, or 12 RPM spindle speed, which is dependent on the viscosity of the sample being tested.

In some embodiments, a flash point of the oxetane compound is at least about 115° C. (e.g., at least about 125° C., at least about 140°, at least about 180° C.). Flash points described herein are open cup flash points determined according to appropriate ASTM protocol.

In some embodiments, a boiling point of the oxetane compound is at least about 110° C. (e.g., at least about 115° C., at least about 117.5° C., at least about 120° C.) at a pressure of 5 mm Hg.

In some embodiments, a molecular weight of the oxetane compound is at least about 130 grams per mole (e.g., at least about 140 grams per mole, at least about 150 grams per mole). The molecular weight of the oxetane compound is typically about 500 grams per mole or less (e.g., about 300 grams per mole or less).

In some embodiments, the oxetane compound includes a carbon chain (e.g., a linear or branched carbon chain) having a length of at least 5 carbon atoms (e.g., at least 6 carbon atoms).

The oxetane compound may include at least two oxetane groups connected by, for example, a linear ether group of the oxetane compound.

In some embodiments, the oxetane compound includes at least one aromatic group (e.g., at least one phenyl group or derivative thereof).

Examples of oxetane compounds include 3,3'-oxybis(methylene)bis(3-ethyloxetane), 1,4-bis(((3-ethyloxetan-3-yl)methoxy)methyl)benzene, and 3-ethyl-3-[(2-ethylhexyloxy)methyl]oxetane.

In some embodiments, the cationic reagent is a siloxane compound that includes at least one siloxane group (e.g., at least two siloxane groups, at least three siloxane groups, or more). For example, the cationic reagent may be a siloxane epoxide (e.g., a siloxane compound including at least one siloxane group and at least one epoxide group). An ink may include a combination of cationic reagents each having at least one siloxane group.

The siloxane compound may have chemical and/or physical properties as desired.

In some embodiments, the cationic reagent includes one or more siloxane groups to the exclusion of linear ether groups. Such reagents are free of linear ether groups.

Examples of siloxane compounds that include at least one epoxide group include disiloxane compounds (e.g., (bis-1,3-[2-(3 {7-oxa-bicyclo[4,1,0]heptyl})ethyl]-1,1,3,3-tetramethyl disiloxane) (PC1000) and epoxide oligomers having a number n epoxide groups where n is at least 2 (e.g., at least 3, at least 4, at least 5, at least 6, at least 7). An exemplary oligomer (PC2003) has the structure:

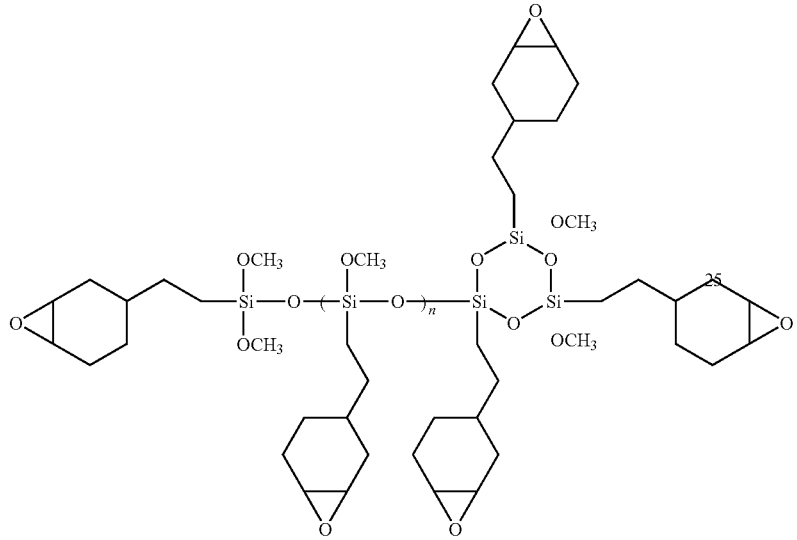

where n is between 2 and 10. In some embodiments, the cationic reagent may be free of silicon and include at least one epoxide group (e.g., at least two epoxide groups or more). An ink can include a combination of such cationic reagents having at least one epoxide group.

Exemplary siloxane compounds can be obtained from POLYSET company, Mechanicville, N.Y.

The cationic reagent including the at least one epoxide group compound may have chemical and/or physical properties as desired.

In some embodiments, the cationic reagent including the at least one epoxide group has a molecular weight of at least about 125 grams per mole (e.g., at least about 135 grams per mole). In some embodiments, the molecular weight of the cationic reagent is about 500 grams per mole or less (e.g., about 450 grams per mole or less).

The cationic reagent including the at least one epoxide group typically has a viscosity of at least about 1.1 centipoises at a temperature of 25° C. The cationic reagent generally has a viscosity of about 20,000 centipoises or less at a temperature of 25° C.

Examples of cationic reagents including at least one epoxide group include cycloaliphatic epoxy compounds such as bis-(3,4-epoxycyclohexyl)adipate, 3,4-epoxycyclohexyl-methyl-3,4-epoxycyclohexane carboxylate, and 7-Oxa-bicyclo[4.1.0]heptane-3-carboxylic acid 7-oxabicyclo[4.1.0] hept-3-ylmethyl ester; ether derivatives including diol derivatives such as 1,4-butanediol diglycidylether and neopentyl glycol diglycidylether; and glycidyl ethers such as n-butyl glycidyl ether, distilled butyl glycidyl ether, 2-ethyl-hexyl glycidyl ether, C8-C10 aliphatic glycidyl ether, C12-C14 aliphatic glycidyl ether, O-cresyl glycidyl ether, P-tertiary butyl phenyl glycidyl ether, nonyl phenyl glycidyl ether, phenyl glycidyl ether, cyclohexanedimethanol diglycidyl ether, polypropylene glycol diglycidyl ether, poly glycol diglycidyl ether, dibromo neopentyl glycol diglycidyl ether, trimethylopropane triglycidyl ether, castor oil triglycidyl ether, propoxylated glycerin triglycidyl ether, sorbitol polyglycidyl ether, glycidyl ester of neodecanoic acid, and glycidyl amines such as epoxidized meta-xylenediamine.

In some embodiments, the ink includes at least two (e.g., at least three or more) cationic reagents. For example, the ink can include at least one oxetane compound in combination with one or more other cationic reagents (e.g., in combination with at least one other oxetane compound, at least one cationic reagent having at least one siloxane group (e.g., a siloxane epoxide), at least one cationic reagent having at least one epoxide group, or a combination thereof). Similarly, the ink can include at least one cationic reagent having at least one siloxane group (e.g., a siloxane epoxide) in combination with one or more other cationic reagents.

The chemical and/or physical properties of the at least two cationic reagents of the ink may be as desired.

In some embodiments, the at least two cationic reagents of the ink have different viscosities. Typically, one of the cationic reagents has a lower viscosity than the other. For example, one of the cationic reagents may have a viscosity at 25° C. of about 50 centipoises or less (e.g., about 35 centipoises or less, about 19 centipoises or less) while the other cationic reagent has a viscosity at 25° C. of about 19 centipoises or more (e.g., about 35 centipoises or more, about 50 centipoises or more, about 100 centipoises or more). Examples of cationic reagents used as a lower viscosity cationic reagent include 1,4-butanediol diglycidylether, neopentyl glycol diglycidylether, and n-Butyl glycidyl ether available as Erisys GE-5 from CVC Specialty Chemicals.

In some embodiments, the cationic reagents have different molecular weights. Typically, one of the cationic reagents has a lower molecular weight than the other. For example, one of the cationic reagents may have a molecular weight of about 350 grams per mole or less (e.g., about 300 grams per mole or less, about 250 grams per mole or less) while the other cationic reagent has a molecular weight of at least about 400 grams per mole (e.g., at least about 750 grams per mole, at least about 1500 grams per mole, at least about 5000 grams per mole, at least about 10000 grams per mole).

A concentration of the cationic reagent(s) in the ink can be as desired. Typically, the concentration is selected to provide the ink with desired properties (e.g., viscosity, hardness, flexibility, and cure speed). In some embodiments, an ink may include a total amount of cationic reagents of at least about 40% by weight (e.g., at least about 60%, at least about 80%, at least about 90%) of cationic reagent(s). The total amount of cationic reagent(s) of the ink may be about 98% or less by weight (e.g., about 95% or less).

In embodiments where the ink includes a combination of cationic reagents, the ink typically includes at least two (e.g., at least three) cationic reagents each having a concentration of at least about 5% by weight of the ink (e.g., at least about 10%, at least about 15%, at least about 20%). For example, an ink may include (a) one or more oxetane compounds having a total concentration of at least about 5% by weight of the ink (e.g., at least about 10%, at least about 15%, at least about 20%) and (b) one or more other cationic reagents including at least one epoxide group (optionally free of silicon) and having a total concentration of at least about 5% by weight of the ink (e.g., at least about 10%, at least about 15%, at least about 20%). As another example, an ink may include (a) one or more siloxane compounds (e.g., siloxane epoxides) having a total concentration of at least about 5% by weight of the ink (e.g., at least about 10%, at least about 15%, at least about 20%) and (b) one or more other cationic reagents free of silicon, including at least one epoxide group, and having a total concentration of at least about 5% by weight of the ink (e.g., at least about 10%, at least about 15%, at least about 20%).

Photoinitiating Systems

A photoinitiating system includes at least one photoinitiator capable of absorbing light (e.g., ultraviolet light) to provide an initiating species capable of initiating polymerization of a cationic reagent or combination of such reagents. For example, a photoinitiator may generate a strong acid upon absorbing light. The strong acid is an initiating species that initiates a ring opening reaction of a cyclic ether of a cationic reagent, which can then react (e.g., polymerize) with the cyclic ether of another cationic reagent.

Examples of photoinitiators include arylsulfonium salts (e.g., UVI 6992 and UVI 6974) such as mixed triarylsulfonoum hexafluoroantimonate or hexafluorophosphate, iodonium salts (e.g., Deuteron UV 2275 available from Deuteron GmbH, Achim Germany; Rhodorsil 2076 available from Rhodia, Lyon, France; LV9385C available from General Electric, Waterford, N.Y.; Bis(t-butylphenyl)iodonium hexafluorophosphate) available from Hampford Research, Inc. of Stratford, Conn.; and Irgacure 250 available from Ciba Specialty Chemicals Corp. of Basel, Switzerland), ferrocenium salts, and diazonium salts.

In some embodiments, the photoinitiating system includes a sensitizer in combination with the photoinitiator. The sensitizer absorbs light (e.g., ultraviolet light and/or visible light) and transfers energy to the photoinitiator, which provides an initiating species (e.g., a strong acid) capable of initiating polymerization of a cationic reagent or combination of such reagents. For a given light flux, the sensitizer can enhance the rate of photoinitiation. Alternatively or in combination, the sensitizer can provide a photoinitiator with the ability to initiate polymerization of cationic reagents upon exposure to longer wavelength light than in the absence of the sensitizer.

Sensitizers can be useful in, for example, inks including particles (e.g., pigment particles such as rutile titania used to color the ink and/or provide opacity) which can decrease the penetration depth of ultraviolet light absorbed by the photoinitiator. Light having a longer wavelength than ultraviolet (e.g., visible light) can penetrate more deeply through ink including the colorant particles to provide more uniform curing of the ink. Sensitizers typically absorb the longer wavelength light more efficiently than the photoinitiator itself thereby enhancing curing of the ink.

The concentration of photoinitiator and the optional sensitizer of an ink can be selected as desired. In some embodiments, the ink includes photoinitiator in the amount of at least about 0.5% by weight (e.g., at least about 1%). The total amount of photoinitiator of the ink may be about 3% or less by weight (e.g., about 2% or less). In some embodiments, the ink includes sensitizer in the amount of at least about 0.01% by weight (e.g., at least about 0.05%). The total amount of sensitizer of the ink may be about 0.5% or less by weight (e.g., about 0.1% or less).

Exemplary sensitizers include at least one aromatic group and include compounds such as 9,10-diethoxy anthracene, 2-ethyl-9,10-dimethoxyanthracene, isopropylthioxanthone, or perylene.

Inhibitors

As discussed above, photoinitiator present in an ink can provide an initiating species (e.g., a strong acid) that polymerizes cationic reagent. In some cases, the photoinitiator may provide such a species even in the absence of light (e.g., thermally). This "dark" generation of initiating species may partially polymerize the ink increasing its viscosity over time (e.g., during storage of the ink over days, weeks, or months at ambient temperature).

An inhibitor reduces (e.g., prevents) polymerization that results from initiating species generated in the dark yet allows polymerization to occur when the ink is exposed to light. Thus, the inhibitor may neutralize initiating species produced in the dark to reduce (e.g., prevent) polymerization from these initiating species. However, the larger number of initiating species produced when the ink is exposed to light during curing allows polymerization to proceed.

Typically, the viscosity increase of an ink with inhibitor is less than the viscosity increase of the same ink but without inhibitor after storage of the inks in the dark for a period of time. In some embodiments, the viscosity of the ink with inhibitor as determined at a temperature of about 68° C. increases by about 10% or less (e.g., about 7.5% or less, about 5% or less) after storage of the ink at 70° in the dark for at least 7 days (e.g., 14 days, 21 days or 30 days).

In some embodiments, the inhibitor is a sulfide compound including a sulfur atom having 3 substituents R1, R2, and R3. The inhibitor typically reacts with an oxonium ion to form a sulfonium ion that has a reduced tendency to propagate the polymerization reaction.

Independently, R1, R2, and R3 may be selected to provide the inhibitor with a desired level of inhibition.

In some embodiments, at least one (e.g., two or three) of R1, R2, and R3 include an alkyl group (e.g., methyl, ethyl, propyl, butyl, pentyl, octyl, nonyl, decyl, or other). The alkyl groups may be different. The alkyl groups may be branched or linear. The alkyl groups may include at least one heteroatom (e.g., halogen, or oxygen). The alkyl groups may include at least one double bond.

In some embodiments, at least one (e.g., two or three) of R1, R2, and R3 include an aromatic group (e.g., benzyl or phenyl). The aromatic groups may be different. The aromatic group may be substituted with, for example, one or more functional groups, one or more heteroatoms, one or more alkyl groups, or combination thereof. Each substituent may be a phenyl group.

In some embodiments, at least one of R1, R2, and R3 is hydrogen.

In some embodiments, R1 and R2 are aromatic and R3 is alkyl.

In some embodiments, the inhibitor is dodecyl sulfide or diphenyl sulfide.

In general, as the number of groups R1, R2, and R3 that are alkyl as compared to aromatic (e.g., phenyl) increases, the inhibitory capability of the compound increases.

In some embodiments, the inhibitor includes a ring substituted with one or more sulfur atoms (e.g., a cycloaliphatic sulfur group). For example, the inhibitor may be a thiane (e.g., 1,4-dithiane).

In some embodiments, the concentration of inhibitor is at least about 0.1% by weight (e.g., at least about 0.3%, at least about 0.75%, at least about 1.5%) of the ink. The concentration of inhibitor is typically about 2% or less by weight (e.g., about 1% or less, about 0.75% or less, about 0.5% or less) of the ink.

In some embodiments, a ratio of a weight of photoinitiator of the ink to a weight of inhibitor is about 30 or less (e.g., about 20 or less, about 15 or less, about 10 or less, about 7 or less). The ratio of the weight of photoinitiator to the weight of inhibitor is typically at least about 1 (e.g., at least about 2, at least about 4).

A combination of different inhibitors may be used. In such case, the inhibitor weights and the inhibitor ratios with respect to photoinitiator refer to total weights.

Colorants

An ink can include one or more colorants (e.g., one or more pigments, one or more dyes, or a combination thereof). Colorants can provide an ink with, for example, a desired color and/or opacity. Exemplary colors include black, cyan, magenta, yellow, red, blue, green, brown, or combinations thereof.

The total amount of colorant may be selected as desired. Typically, the ink includes a total amount of colorant of at least about 0.5% by weight (e.g., at least about 3%). The total amount of colorant may be about 30% or less by weight of the ink (e.g., about 20% by weight or less, about 10% by weight or less, about 5% or less).

In some embodiments, the colorant is in the form of particles (e.g., pigment particles). In such embodiments, the particles are generally sufficiently small to permit free flow of the ink through an inkjet printing device. The particle sizes are generally selected to provide good dispersion stability.

Examples of suitable pigments particles include pigment blacks 7, carbon black, graphite; and pigment white titanium dioxide. Additional examples are disclosed in, e.g., U.S. Pat. No. 5,389,133, which is incorporated by reference herein. The pigment may also have a modifying group on its surface, such as an oxygen-containing functionality (e.g., a carboxyl or phenol group).

White inks can be made using a titania dispersion. The titania dispersion may include, for example, a blend of titania particles having a surface area of between about 8 and about 14 meters squared per gram. The primary particles size of the titania may be between about 190 and 410 nanometers. The titania particles are preferably dispersed into a concentrate using a combination of monomer and dispersant as the dispersing aid, which can result, for example, in about 60% to about 70% by weight titania. However, other concentrations can also be suitable, for example, a titania concentration of about 50% by weight.

Examples of dyes include Orasol Pink 5BLG, Black RLI, Blue 2GLN, Red G, Yellow 2GLN, Blue GN, Blue BLN, Black CN, and Brown CR (all available from Ciba-Geigy, Inc., Mississauga, Ontario); Morfast Blue 100, Red 101, Red 104, Yellow 102, Black 101, and Black 108 (all available from Morton Chemical Company, Ajax, Ontario); and a mixture thereof. Additional examples include those disclosed in, e.g., U.S. Pat. No. 5,389,133, which is incorporated by reference herein.

Rheological Modifying Additives

Examples of rheological modifying additives include additives that can participate during the UV polymerization of the cationic reagents (e.g., monomers). Using a hydroxy functional rheological modifier can reduce the amount of unpolymerized cationic reagent in the ink, potentially improving the final film properties.

In some embodiments, the rheological modifier is an ester (e.g., a straight chain even numbered monoesters having a carbon chain length of, for example, from C-28 to C-34). In some embodiments, the majority of the rheological modifiers have a chain length of about C-32 and the modifier has a melting point of about 48° C. Examples of such compounds include KESTER WAX (e.g., Ester Wax: K-48 and K-56, KOSTER KEUNEN, INC.). Kester Wax K-48 (synthetic Spermaceti/Cetyl Esters NF) is cetyl palmitate and straight chain even numbered monoesters having a carbon chain length from C-28 to C-34 with the greastest concentration at C-32 (mp ~48° C.). K-56 is cetearyl stearate (stearyl stearate) and mp ~54-56° C. (also available from KOSTER).

Examples of rheological modifying additives include hydrogenated cator oil, beeswax, and other additives that include hydroxy containing moieties such as monoalcohols, diols, and glyceryls. Examples of monoalcohols include stearyl alcohol (available from Aldrich Chemical, Milwaukee, Wis.) and Unilin 350 (available from Petrolite of Sugar Land, Texas). Examples of diols include 1,12-stearyldiol (available as Speziol 18/2 from Cognis Corp. USA Cincinnati, Ohio), 1,10-decanediol (available as Speziol 10/2 from Cognis Corp. USA Cincinnati, Ohio), or di-trimethylolpropane. Examples of glyceryls include tallow glycerides.

The amount of rheological modifier can be selected as desired. In some embodiments, the ink includes at total amount of rheological modifier of at least about 1% by weight (e.g., at least about 3%, at least about 20%). The total amount of rheological modifier of the ink may be about 30% or less by weight (e.g., about 15% or less, e.g., about 7% or less).

Other examples rheological modifying additives include compounds such as erucyl stearamide and ethylene glycol distearate.

Other Ink Components

The pigmented jettable ink can also include a polymeric dispersant. The polymeric dispersant can assist in stabilizing the pigment in the jettable ink. The dispersant can, for example, prevent agglomeration of the pigment. The ink can include between about 1% and 10% by weight dispersant (e.g., between about 3% and 8% by weight dispersant).

Examples of dispersants include Solsperse 13,650, 13,940, 17,000, 24,000, 32,000, 36,000; Byk 108; Tego Dispers 700; UNIQEMA 5543; and EFKA 5244, 5207, 6750; which are all commercially available from Avecia; Byk Chemie; Tego Chemie; Zephryn Uniquema; and EFKA additives, respectively.

The amount of dispersant required is generally based on the amount of pigment in the ink (e.g., the surface area of pigment particles in grams per meter squared). The dispersant used typically depends on ink composition including, for example, properties of the cationic reagent and/or pigment. The selected dispersant can be soluble in the vehicle, can lack volatility at an elevated temperature (e.g., 120° C.), and can have good affinity for the pigment. The dispersant can also include a synergist that aids dispersion.

In addition to or in place of a dispersant, a surfactant compound can be used. The surfactant compound can serve to alter the surface tension of the ink, and can be an anionic, cationic, nonionic or amphoteric surfactant compound, such as those described in McCutcheon's Functional Materials, North American Edition, Manufacturing Confectioner Publishing Co., Glen Rock, N.J., pp. 110-129 (1990). Examples of surfactants include copolymers such as SILWET® copolymers including Silwet L-7604, available from Crompton, OSi Specialties division. The copolymers are generally comprised of ethylene oxide, propylene oxide, and/or silicone. Other examples of surfactants include 3M FC430 available from 3M of St. Paul, Minn. and F50-100 available from DuPont Chemicals of Wilmington, Del.

Ink Properties

Inks described herein typically have chemical and physical properties that allow the inks to be jetted onto a substrate by an inkjet printer (e.g., by one or more nozzles of a print head of an inkjet printer).

In some embodiments, a viscosity of the ink is about 50 centipoise or less (e.g., about 45 centipoise or less, about 35 centipoise or less, about 20 centipoises or less, about 15 centipoises or less) at printing temperature. The viscosity of the ink may be at least about 1 centipoise (e.g., at least about 5 centipoise, at least about 7 centipoise, at least about 9 centipoises) at printing temperature. During a typical thermal inkjet printing process, the ink is heated to a printing temperature of at least about 50° C. (e.g., at least about 60° C., at least about 65° C., at least about 72° C.). Typically, the printing temperature of the ink does not exceed about 90° C. (e.g., about 85° C., about 80°, about 75° C.). For example, in some embodiments, the printing temperature is between about 65° C. to about 72° C. (e.g., about 68° C.). At jetting temperature, optimal jetting viscosity is generally based on the print head being used and is typically specified by the print head manufacturer.

In some embodiments, the ink (e.g., a cured mark formed from the ink) has an modified ASTM 3363 pencil hardness test, with using of A400 sandpaper from 3M 413Q Wetordry, value of at least 2H (e.g., at least 3H, at least 4H). For purposes of this application, the test should be conducted using a VWR precleaned frosted glass slide Cat. number 48312-013, produced by VWR International, Inc. of West Chester, Pa., or an equivalent micro glass slide. The model 3363 Pencil Scratch Hardness Tester (from Paul N. Gardner Company, Inc, Pompano Beach, Fla.) includes a pencil lead holder carried on two rollers, the weight of which is so arranged that the pressure exerted by the flat pencil lead is approximately 300 grams. A test board is placed on a firm horizontal surface and a pencil is then held firmly against a solder mask at a 45 degree angle. Pencils grading from 4B (soft) to 9H (hard) can be used to grade the hardness of the cured mark.

In some embodiments, the ink (e.g., a cured mark formed of the ink) passed the acetone wipe test for chemical resistance. In general, cured samples are double rubbed with a cotton swab wetted with acetone. The sample is rubbed across the surface with soaked cotton tipped applicator at least 20 times (or 30, 50 times). Passing is defined as having no sample come off the substrate. Failing is defined as sample being easily removed from the substrate.

In some embodiments, the ink can pass at least some (e.g., all) of the aforementioned tests (e.g., modified ASTM 3363 pencil hardness, acetone rub) when cured at a speed of about 2 fpm or more (e.g., about 5 fpm or more, about 10 fpm or more, about 25 fpm or more, about 35 fpm or more) using a Fusion 300 UV Inc. F300 irradiation with a 300 Watt UV source (e.g., a D lamp and a half aluminum reflector) after jetting onto a substrate (e.g., a non-porous substrate such as a glass or a metal).

Preparing Inks

To prepare an ink, one can combine all of the composition ingredients, heat the resulting combination, and if necessary, mill.

In some instances, the ink is prepared by blending all components except for the rheology modifier and pigment. Each clear sample and rheology modifier is heated (e.g., to about 80° C.). The rheology modifier is then added to the other components of the mixture as a liquid to check for solubility, if no solubility issues are seen then the pigment added, typically as a concentrate.

A pigment concentrate can be prepared by combining a pigment with an amount of at least some (e.g., all) components of an ink to be prepared to provide a concentrate having a higher concentration of pigment than the final ink. The pigment concentrate can improve pigment grinding and reduced process time.

In the pigment concentrate, the number density of pigment particles is increased, which allows for more particle-particle and particle-grinding media collisions, which in turn decreases the amount of time needed to reach a desired particle size. Additionally, in the concentrate the particles have higher odds of coming in contact with dispersant/surfactant molecules if present. These materials preferably adsorb onto the surface of the particles so that the reduced size particles do not agglomerate. By increasing the odds of particle-dispersant collisions, the grind time can be reduced and the particle size stability can be increased.

For example, to prepare a carbon black pigment concentrate, the amount of dispersant to be used is calculated (the calculation can be based on the desired pigment particle size, the calculated pigment surface area (supplied by the pigment manufacturer), or both). A fluid vehicle and dispersant are charged into an appropriate vessel. The vehicle and dispersant are mixed until fully blended (some gentle heating may be necessary if the dispersant is a solid). The vehicle/dispersant mixture are moved to a high shear mixer and the pigment is slowly charged. The materials are milled to obtain the pigment concentrate.

For a liquid ink, all liquid monomers and oligomers are mixed, and photoinitiators are added to the mixture. If the photoinitiators are solid, they are preferably fully dissolved in the mixture. Then, the pigment concentrate is added to obtain the liquid ink. If necessary, the ink is filtered through a 1 µm filter.

For a solid ink, all monomers and oligomers are heated, mixed, and photoinitiators are added to the liquefied mixture. If the photoinitiators are solid, they are preferably fully dissolved in the mixture. Then, the pigment concentrate is added to obtain the ink. If necessary, the ink is heated and filtered.

In some embodiments, an ink is prepared by combining all components except for the photoinitiating system. The combined components are heated to facilitate mixing (e.g., to about 70 to about 80° C.) and milled. The photoinitiating system component(s) are added to the milled components and the mixture is filtered. In some cases, the milled components are still warm (e.g., about 70° C.) when the photoinitiating system is added.

Printing and Curing Methods

A method of printing (e.g., inkjet printing) and curing an ink image includes printing an ink composition on a substrate to form a mark, and curing the mark by exposure to light (e.g., visible light, ultraviolet radiation having a wavelength of less than about 400 nanometers, or a combination thereof).

Figure 1B:
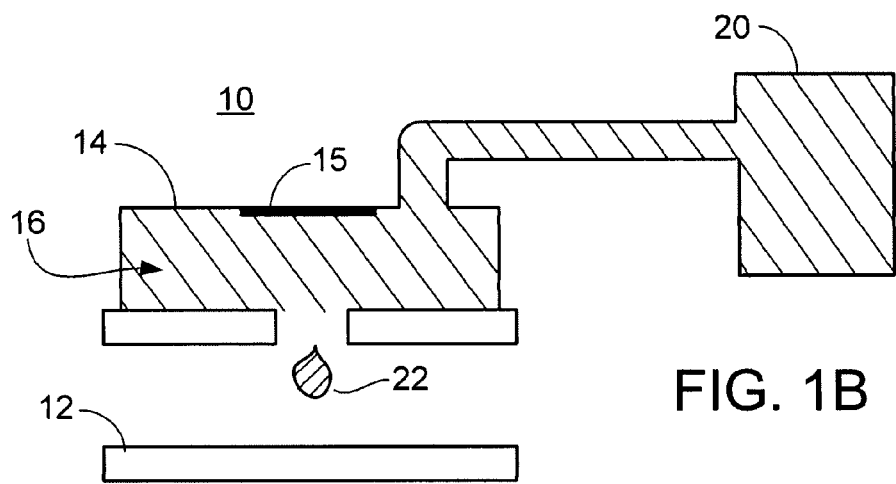
Figure 1C:
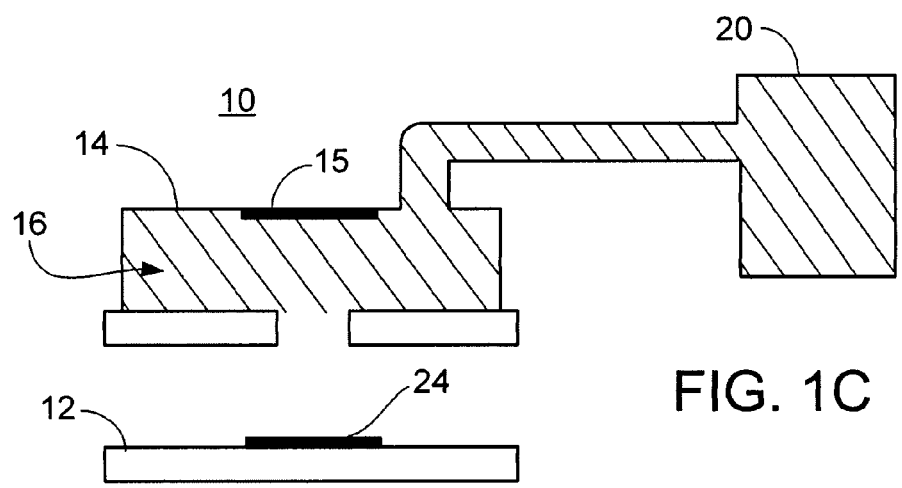

Referring to FIGS. 1A-1C, an inkjet printer printing assembly 10 for printing on a substrate 12 includes a print head 14 having a print head ink reservoir 16, a nozzle 18, and an actuator 15 (e.g., a heat source or piezoelectric element). Assembly 10 also includes a primary ink reservoir 20 (e.g., a ink cartridge) connected to print head 14. In use, actuator 15 is actuated (e.g., by heating the ink and/or applying oscillatory energy to the ink within print head reservoir 16) to eject ink (FIG. 1B) from nozzle 18 (e.g., in the form of one or more droplets 22 directed at substrate 12). Ink that contacts substrate 12 forms a mark 24 (FIG. 1C), which can be cured (e.g., by exposure to light). Although only one ink composition is shown, the printing assembly can be configured to print marks formed of each of multiple ink compositions. Also, the printing assembly can include multiple nozzles.

Exemplary substrates include fiber (e.g., wood or paper), glass, polymers, and printed circuit boards (e.g., a circuit board from Vermont Circuits, Inc., part number 5454, of Brattleboro, Vt.).

For curing the mark(s), a radiation line source can be used to provide uniform light exposure over a desired area of one or more substrates. The line source may include an ultraviolet lamp (e.g., Fusion UV Inc. F300 irradiation with a D lamp and a half aluminum reflector). Other lamps (e.g., an H lamp or V lamp) may be used. Other suitable printing and curing means may also be used, such as methods of printing described in: Leach, R. H., Pierce, R. J., The Printing Ink Manual, Blueprint (Chapman & Hall), 5th ed., 1993. An example of a printing system is Markem 4000 system available from Markem Corp., NH.

In some embodiments, one or more marks are applied to a substrate. The mark(s) is then removed (e.g., by mechanical action (e.g., wiping), washing, or both). At least one additional mark is applied to the substrate (e.g., to a location that at least partially (e.g., mostly or completely) overlies a location occupied by the previous mark(s)). The additional mark(s) can be essentially identical in form to the previous marks (e.g., both may have the same shape or color). The additional mark may differ from the previous marks substantially (e.g., only) in some properties (e.g., color related properties (e.g., tone, hue, or the like) or shape. The further marks are cured (e.g., by exposure to light). Such an embodiment can be useful if, for example, one wishes to modify the appearance (e.g., properties related to color or shape) of a mark prior to curing the ink of the mark.

In some embodiments, a mark is exposed to light (e.g., UV radiation) only after at least about 2 seconds (e.g., at least about 5 seconds, at least about 10 seconds, at least about 20 seconds, at least about 30 seconds, at least about 1 minute, at least about 5 minutes, at least about 10 minutes, at least about 30 minutes, at least about 60 minutes, at least about 90 minutes, at least about 5 hours, at least about 10 hours, at least about 16 hours, or at least about 24 hours.

In some embodiments, at least one mark is formed on each of multiple substrates (e.g., at least 2 substrates, at least 3 substrates, at least 5 substrates, at least 10 substrates, at least 25 substrates, at least 50 substrates). After forming the mark(s) on the multiple substrates, the substrates are cured by exposure to light.

EXAMPLES

The examples are illustrative, and not intended to be limiting.

Example 1

UV-Epoxy Inks Including Siloxane Based Monomers

Ink compositions including UV curable cationic monomers as shown in Table 1 below were prepared by blending the components of each sample in a scintillation vial and uniformly heating the vial to 80° C. This allowed the photoinitiator to be solvated and mixed with the other materials. All samples were compatible. The vials with ink compositions were then inverted at least 20 times. A magnetic stir-bar was placed in each vial, which was then stirred for about 10-15 minutes with mild heating. The samples were then cooled and 0.5 militers of ink drawn downs were prepared on a substrate (glass slides). The draw-downs were run under a Fusion 300 UV-system under a D-bulb (½ elliptical aluminum reflector) at varying belt speeds in feet per minute.

All samples were tack free immediately after UV exposure and no surface wrinkling was observed for samples cured at 5 fpm (feet per minute). Cured samples with different cure speed were tested for adhesion using the acetone rub and the scratch t est. Of the PC-series, sample C has the best film properties at 25 fpm, partially passing the acetone rub. This sample exhibited curing at up to 250 fpm.

The formulations of the inks are shown in Table 1 below:

TABLE 1

Cationic Epoxy Monomer Inks Having an Siloxane Based Monomers

| Material | A | B | C |
|---|---|---|---|
| PC1000 | | 21% | |
| PC2003 | | 11% | 32% |
| Uvacure 1500 | 32% | | |
| Erisys GE-21 | 32% | 32% | 32% |
| Erisys GE-30 | 32% | 32% | 32% |
| UVI 6992 | 6% | 6% | 6% |

A viscosity of each sample was determined using the Brookfield Programmable Rheometer at 68° C. at 60 rpm using the #18 spindle. The samples were placed into an aluminum rheometer vial and placed into the Rheometer. The sample was allowed to equilibrate at 68° C. for 15 minutes before the data points were collected. The viscosity of all samples was between 10~16 cps at 68° C., except sample C (~19 cps), which was good jettable viscosity by ink jet printer.

Example 2

UV-Epoxy Inks Including Oxetane Monomers

Ink compositions comprising at least one of each of two different oxetane based monomers (3,3'-oxybis(methylene) bis(3-ethyloxetane) (DOX) and 1,4-bis(((3-ethyloxetan-3-yl) methoxy)methyl)benzene (XDO)) were prepared. The compositions were prepared as in Example 1, with heating to 70° C. to facilitate mixing. All samples were compatible. The compositions are shown in Table 2.

TABLE 2

Epoxy Inks Including Oxetane Based Monomer

| Material | 2A | 2B |
|---|---|---|
| UVACURE 1500 | 55.50 | 55.00 |
| UVI 6992 | 5 | 5 |
| 9,10-Diethoxy anthracene | 0.5 | 0.5 |
| Dodecyl sulfide | 0.3 | 0.3 |
| Kester K-56 | 1.5 | 1.5 |
| TiO2 | 10 | 10 |
| DOX | 27.20 | 17.70 |
| XDO | 0 | 10 |

* values are weight percent

Draw-downs (0.5 milliliter each) of the ink samples on a glass slide were exposed under the Fusion 300 UV-system under the D-bulb (½ elliptical aluminum reflector) at 5 fpm. All samples were tack free immediately after UV exposure and no surface wrinkling was observed. The samples passed the acetone rub and scratch test at 5 fpm exposure rates.

Viscosities were determined using the Brookfield Programmable Rheometer as per Example 1. The viscosity of composition 2A was 12.2 cps at 68° C. and the viscosity of composition 2B was 15.4 cps at 68° C.

To evaluate jetting performance, compositions 2A and 2B was loaded into a Nova 300 dpi printhead (Spectra Corporation, Hanover, N.H.) and jetted at 68° C. Several marks of both compositions (2A and 2B) were prepared, cured under the D-bulb at 5 fpm with and without post cure heating (5 minute at 110° C. in oven). The cured marks were tested for performance using the ASTM 3363 pencil hardness test. The test value on a glass substrate of all samples was 5H or over.

Example 3

UV-Epoxy Inks Including Sulfide Initiator

Ink compositions including different concentration of dodecyl sulfide were prepared by blending the components of each sample as described in Example 1. Compositions are shown in Table 3. All samples were compatible.

TABLE 3

Epoxy Inks Including Sulfide Inhibitor

| Material | 3A | 3B | 3C | 3D |
|---|---|---|---|---|
| UVACURE 1500 | 38.00 | 38.00 | 38.00 | 38.00 |
| DOX | 44.50 | 44.50 | 44.50 | 44.50 |
| TiO$_2$ | 10.00 | 10.00 | 10.00 | 10.00 |
| UVI 6992 | 5 | 5 | 5 | 5 |
| 9,10-Diethoxy anthracene | 0.5 | 0.5 | 0.5 | 0.5 |
| Kester K-48 | 2 | 2 | 2 | 2 |
| Dodecyl sulfide | 0 | 0.3 | 0.5 | 1 |

* values are weight percent

An amount of each sample (about 50 grams) was stored in a (8 ounce black polypropylene jar) in the dark at a temperature of 70° C. Aliquots of the ink compositions were collected 3, 7, and 14 days. The viscosity of the ink of each aliquot was determined using the Brookfield Programmable Rheometer using a #18 spindle. The starting viscosity of each ink was 9.3 cps at 68° C. The viscosities of the inks (68° C.) are shown in Table 4 below.

TABLE 4

Viscosities of Inks With Sulfide Inhibitors

| | Sulfide inhibitor | Day 3 (cps) | Day 7 (cps) | Day 14 (cps) |
|---|---|---|---|---|
| 3A | 0% | 10.6 | 30.49 | Solid gel form |
| 3B | 0.3% | 9.15 | 10.4 | 16 |
| 3C | 0.5% | 9.35 | 10.05 | 11.75 |
| 3D | 1.0% | 9.8 | 10.0 | 10.2 |

After 7 days, the viscosities of compositions 3B, 3C and 3D were essentially unchanged, while composition 3A was significantly more viscous. After 14 days, composition 3B exhibited as slight viscosity increase (about 5 cps), but the viscosities of compositions 3C and 3D had increased by about 2 cps or less. This experiment was repeated with the same results.

All publications, patents, applications, and references cited herein are hereby incorporated by reference in their entireties.

Other embodiments are within the scope of the following claims. For example, other cationic monomers beside epoxy monomers can be used in the inks. Examples include vinyl ethers or a combination of vinyl ethers and epoxy monomers.

What is claimed is:

1. A method, comprising:
   jetting a cationic ink onto a substrate to provide a mark, the ink comprising:
   a cationic reagent;
   a photoinitiating system;
   a cationic polymerization inhibitor compound selected from the group consisting of a diphenyl sulfide compound, a di-alkyl sulfide compound, and a combination thereof; and
   a colorant; and
   curing the ink by exposing the mark to light.

2. The method of claim 1, wherein the cationic reagent comprises an epoxide compound.

3. The method of claim 2, wherein the cationic reagent comprises at least one of a siloxane epoxide compound, a cylcoaliphatic epoxide compound, or a glycidyl ether epoxide compound.

4. The method of claim 2, wherein the epoxide compound has multiple epoxy rings.

5. The method of claim 2, wherein the ink comprises at least about 20% by weight of oxetane compound and at least about 20% by weight of the epoxide compound.

6. The method of claim 1, wherein the cationic reagent comprises an oxetane compound.

7. The method of claim 6, wherein the oxetane compound comprises at least two oxetane groups.

8. A method comprising jetting an ink comprising a cationic reagent, and a cationic polymerization inhibitor compound selected from the group consisting of a diphenyl sulfide compound, a di-alkyl sulfide compound, and a combination thereof onto a substrate.

9. An ink composition, comprising:
   a cationic reagent;
   a photoinitiating system;
   a cationic polymerization inhibitor compound selected from the group consisting of a diphenyl sulfide compound, a di-alkyl sulfide compound, and a combination thereof; and
   a colorant.

10. The composition of claim 9, wherein the composition has a viscosity of less than about 50 centipoises.

11. An inkjet printer nozzle comprising the composition of claim 9.

12. The composition of claim 9, wherein the composition has a viscosity determined at a temperature of 68° C. that increases by about 10% or less after storage of the composition in the dark for 7 days.

13. The composition of claim 9, wherein the cationic reagent comprises an oxetane compound.

14. The composition of claim 13, wherein the oxetane compound comprises at least two oxetane groups.

15. An inkjet printer cartridge, comprising:
   a reservoir comprising a composition comprising:
   a cationic reagent;
   a photoinitiating system;
   a cationic polymerization inhibitor compound selected from the group consisting of a diphenyl sulfide compound, a di-alkyl sulfide compound, and a combination thereof; and
   a colorant.

16. An ink composition, comprising:
   a cationic reagent;
   a photoinitiating system;
   a sulfide polymerization inhibitor compound selected from the group consisting of a diphenyl sulfide compound, a dodecyl sulfide compound, and a combination thereof; and
   a colorant.

* * * * *